(12) United States Patent
Hsieh et al.

(10) Patent No.: US 10,942,803 B2
(45) Date of Patent: Mar. 9, 2021

(54) METHOD FOR PERFORMING DATA PROCESSING FOR ERROR HANDLING IN MEMORY DEVICE, ASSOCIATED MEMORY DEVICE AND CONTROLLER THEREOF, AND ASSOCIATED ELECTRONIC DEVICE

(71) Applicant: Silicon Motion Inc., Hsinchu County (TW)

(72) Inventors: Hung-En Hsieh, Changhua County (TW); Che-Yi Wu, Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 3 days.

(21) Appl. No.: 15/865,266

(22) Filed: Jan. 9, 2018

(65) Prior Publication Data

US 2019/0065305 A1     Feb. 28, 2019

(30) Foreign Application Priority Data

Aug. 30, 2017   (TW) .................................. 106129536

(51) Int. Cl.
*G06F 12/02*      (2006.01)
*G06F 3/06*       (2006.01)
(Continued)

(52) U.S. Cl.
CPC ........ *G06F 11/1048* (2013.01); *G06F 3/0619* (2013.01); *G06F 3/0659* (2013.01);
(Continued)

(58) Field of Classification Search
CPC .. G06F 11/1048; G06F 3/0619; G06F 3/0679; G06F 3/0659; G06F 12/0246;
(Continued)

(56) References Cited

U.S. PATENT DOCUMENTS 5,297,263 A * 3/1994 Ohtsuka ................ G06F 9/3867
712/244
7,730,330 B1 * 6/2010 Fleischmann ......... G06F 1/3234
713/300

(Continued)

FOREIGN PATENT DOCUMENTS

TW         201724761 A      7/2017
TW         I592937 B        7/2017

*Primary Examiner* — Charles Rones
*Assistant Examiner* — Tong B. Vo
(74) *Attorney, Agent, or Firm* — Winston Hsu (57) ABSTRACT

A method for performing data processing for error handling in a memory device, the memory device and the controller thereof, and the associated electronic device are provided. The method may include: programming a codeword of a set of data into a non-volatile (NV) memory, wherein the codeword includes the set of data and a parity-check code; reading the codeword from a volatile memory to generate readout data of the codeword; determining whether the readout data is correct according to the readout version of the set of data and the readout version of the parity-check code; and when determining that the readout data is correct, outputting the readout version of the set of data as the set of data for further usage of the processing circuit, otherwise, sending a predetermined signal to the processing circuit and storing error information regarding the set of data into a register of the controller.

20 Claims, 6 Drawing Sheets

(51) Int. Cl.
*G06F 12/1009* (2016.01)
*G06F 11/10* (2006.01)
*H03M 13/09* (2006.01)
*G11C 11/56* (2006.01)
*G06F 11/07* (2006.01)

(52) U.S. Cl.
CPC ........ *G06F 3/0679* (2013.01); *G06F 11/1004* (2013.01); *G06F 11/108* (2013.01); *G06F 12/0246* (2013.01); *H03M 13/09* (2013.01)

(58) Field of Classification Search
CPC ............ G06F 11/1012; G06F 11/1064; G06F 11/1004; G06F 11/108; H03M 13/09; H03M 11/1064; G11C 16/06
See application file for complete search history.

(56) References Cited

U.S. PATENT DOCUMENTS

| | | | |
|---|---|---|---|
| 7,962,836 B1* | 6/2011 | Lee ................... | H03M 13/1575 714/781 |
| 2009/0199049 A1* | 8/2009 | Yorimitsu .......... | G11B 20/1883 714/55 |
| 2012/0198310 A1* | 8/2012 | Tran ........................ | G06F 7/483 714/763 |
| 2012/0284484 A1* | 11/2012 | Abdul .................. | G06F 9/5077 711/173 |
| 2013/0145231 A1 | 6/2013 | Frayer | |
| 2014/0181615 A1* | 6/2014 | Kwok .................... | G06F 11/00 714/755 |
| 2015/0243373 A1* | 8/2015 | Chun .................. | G06F 11/1076 714/710 |
| 2015/0270002 A1* | 9/2015 | Battista ................ | G11C 16/045 365/185.08 |
| 2016/0163382 A1 | 6/2016 | Conley | |
| 2016/0335145 A1* | 11/2016 | Toba .................. | G06F 11/0754 |
| 2017/0046218 A1* | 2/2017 | Krishnappa .......... | G06F 11/1008 |
| 2018/0059937 A1* | 3/2018 | Kim .................... | G06F 11/1048 |

* cited by examiner

METHOD FOR PERFORMING DATA PROCESSING FOR ERROR HANDLING IN MEMORY DEVICE, ASSOCIATED MEMORY DEVICE AND CONTROLLER THEREOF, AND ASSOCIATED ELECTRONIC DEVICE

BACKGROUND OF THE INVENTION

1. Field of the Invention

The present invention relates to access to a flash memory, and more particularly to a method for performing data processing for error handling in a memory device, associated memory device, and control thereof and associated electronic device.

2. Description of the Prior Art

Recently, due to continuous development on memory technologies, various portable or non-portable memory devices (e.g., memory cards compliant with SD/MMC, CF, MS, XD or UFS standard; or solid state disk; or embedded storage devices compliant with USF or EMMC standard) are widely implemented in various applications. Therefore, access control of these memory devices has become a very popular topic.

In terms of commonly used NAND type flash memory, it comprises two different types, which are single-level cell (SLC) flash memory and multi-level cell (MLC) flash memory. In the SLC flash memory, each transistor that is treated as a memory cell only has two charge values, representing the logic 0 and the logic 1, respectively. In contrast to this, storage capacity of each transistor that is treated as a memory cell in the MLC flash memory, is fully used, which relies on a higher voltage to record at least two sets of bit information in a single transistor through different voltage levels (e.g. 00, 01, 11, 10). Theoretically, the areal density of MLC flash memory can reach at least double that of SLC flash memory. This is desirable news for industries of NAND type flash memory which has encountered bottlenecks in development.

In contrast to SLC flash memory, MLC flash memory is cheaper and compact, which provides larger volume in a limited space. Hence, MLC flash memory quickly becomes the mainstream of memory devices on the market. However, the problems caused by the instability of MLC flash memory also emerge. In order to ensure that access control of the memory device conducted on the flash memory can comply with relevant specifications, the controller of the flash memory is usually provided with certain management mechanisms to properly manage data access.

According to the related art, memory devices with these management mechanisms still have disadvantages. For example, a static random access memory (SRAM) used to temporarily store data may be fabricated using an advanced fabrication process, such as a 16 nm process. Under such condition, data stored in the memory may have a certain bit flipped due to external temperature or other factors. If such data is important system data, the bit flipping may cause the system crush. Therefore, there is a need for providing an inventive method and related architecture to enhance the performance of memory devices without side effects or with the less probability of causing side effects.

SUMMARY OF THE INVENTION

It is one object of the present invention to provide a method for performing data processing for error handling in a memory device, associated memory device and controller thereof, and associated electronic device to address the above problems.

It is another object of the present invention to provide a method for performing data processing for error handling in a memory device, associated related memory device and controller thereof, and associated electronic device, in order to improve the performance of the memory device without side effects or with the less probability of causing side effects.

According to at least one embodiment, a method for performing data processing for error handling in a memory device is provided. The memory device comprises: a non-volatile memory (NV memory), wherein the NV memory comprises at least one NV memory element. The method comprises: when a controller of the memory device is controlling at least one operation of the memory device, receiving a set of data from a processing circuit of the controller for writing into a volatile memory of the controller, wherein the controller is disposed in the memory device and outside of at least one NV memory element, any one of the processing circuit and the volatile memory is disposed in the controller and outside of the other one of the processing circuit and the volatile memory, and the set of data is associated with the at least one operation controlled by the controller. The method also comprises: before the set of data is written into the volatile memory, encoding the set of data to generate a parity-check code of the set of data; writing a codeword of the set of data into the volatile memory, wherein the codeword comprises the set of data and the parity-check code; reading the codeword from the volatile memory to generate a readout data of the codeword, wherein the readout data comprises a readout version of the set of data and a readout version of the parity-check code; determining whether the readout data is correct according to the readout version of the set of data and the readout version of the parity-check code; and when the readout data is determined correct, outputting the readout version of the set of data, as the set of data, to the processing circuit for further processing; otherwise, sending a predetermined signal to the processing circuit and storing error information regarding the set of data into a register, wherein the register is disposed in the controller and outside of any one of the processing circuit and the volatile memory.

According to at least one embodiment, a memory device is provided. The memory device comprises: a non-volatile memory (NV memory) arranged to store information, wherein the NV memory comprises at least one NV memory element; and a controller, coupled to the NV memory, arranged to control at least one operation of the memory device. The controller comprises a processing circuit, a volatile memory, an encoding and decoding circuit and a register, wherein the encoding and decoding circuit comprises an encoding circuit and a decoding circuit and each one of the encoding circuit and the decoding circuit is coupled to the processing circuit and the volatile memory. The register is coupled to the decoding circuit. For example, the processing circuit is operable to control the controller according to a command from a host device, allowing the host device to access the NV memory via the controller. The volatile memory is arranged to provide internal storage space to the controller, thereby allowing the controller to control the at least one operation of the memory device. The encoding and decoding circuit is operable to perform data processing. Further, when the controller is controlling the at least one operation of the memory device, the encoding circuit is operable to receive a set of data from the processing circuit for writing into the volatile memory, wherein the set of data is associated with the at least one operation controlled by the controller. Before the set of data is written into the volatile memory, the encoding circuit is operable to encode the set of data to generate a parity-check code of the set of data. The encoding circuit is operable to write a codeword of the set of data into the volatile memory, and the codeword comprises the set of data and the parity-check code. The decoding circuit is operable to read the codeword from the volatile memory to generate a readout data of the codeword and the readout data comprises a readout version of the set of data and a readout version of the parity-check code. The decoding circuit is operable to determine whether the readout data is correct according to the readout version of the set of data and the readout version of the parity-check code. When the readout data is determined correct, the decoding circuit is operable to output the readout version of the set of data, as the set of data, to the processing circuit for further processing; otherwise, the decoding circuit is operable to send a predetermined signal to the processing circuit and store error information regarding the set of data into the register, wherein the register is operable to store the error information the set of data.

According to some embodiments, the present invention further provides an electronic device, which comprises the above-mentioned memory device and further the host device. The host device is coupled to the memory device and comprises at least one processor arranged to control operations of the host device. In addition, the memory device is operable to provide storage space to the host device.

According to at least one embodiment, a controller for use in a memory device is provided. The memory device includes the controller and a non-volatile memory (NV memory). The NV memory includes at least one NV memory element. The controller comprises a processing circuit, a volatile memory, an encoding and decoding circuit and a register, wherein the encoding and decoding circuit comprises an encoding circuit and a decoding circuit and each one of the encoding circuit and the decoding circuit is coupled to the processing circuit and the volatile memory. The register is coupled to the decoding circuit. For example, the processing circuit is operable to control the controller according to a command from a host device, allowing the host device to access the NV memory via the controller. The volatile memory is arranged to provide internal storage space to the controller, thereby allowing the controller to control the at least one operation of the memory device. The encoding and decoding circuit is operable to perform data processing. When the controller is controlling the at least one operation of the memory device, the encoding circuit is operable to receive a set of data from the processing circuit for writing into the volatile memory, wherein the set of data is associated with the at least one operation controlled by the controller. Before the set of data is written into the volatile memory, the encoding circuit is operable to encode the set of data to generate a parity-check code of the set of data. The encoding circuit is operable to write a codeword of the set of data into the volatile memory, and the codeword comprises the set of data and the parity-check code. In addition, the decoding circuit is operable to read the codeword from the volatile memory to generate a readout data of the codeword and the readout data comprises a readout version of the set of data and a readout version of the parity-check code. The decoding circuit is operable to determine whether the readout data is correct according to the readout version of the set of data and the readout version of the parity-check code. When the readout data is determined correct, the decoding circuit is operable to output the readout version of the set of data, as the set of data, to the processing circuit for further processing; otherwise, the decoding circuit is operable to send a predetermined signal to the processing circuit and store error information regarding the set of data into the register, wherein the register is operable to store the error information the set of data.

One of advantages of the present invention is that the present invention is operable to provide proper control on operations of the controller, so as to prevent unexplained errors in the memory device from being untraceable. In addition, implementations based on embodiments of the present invention do not add many extra costs. Therefore, the problems in the related art can be solved without increasing the overall cost much. Compared with the related art, the present invention can improve the performance of a memory device without any side effects or with the less probability of causing side effects.

These and other objectives of the present invention will no doubt become obvious to those of ordinary skill in the art after reading the following detailed description of the preferred embodiment that is illustrated in the various figures and drawings.

DETAILED DESCRIPTION

I. Memory System

Figure 1:
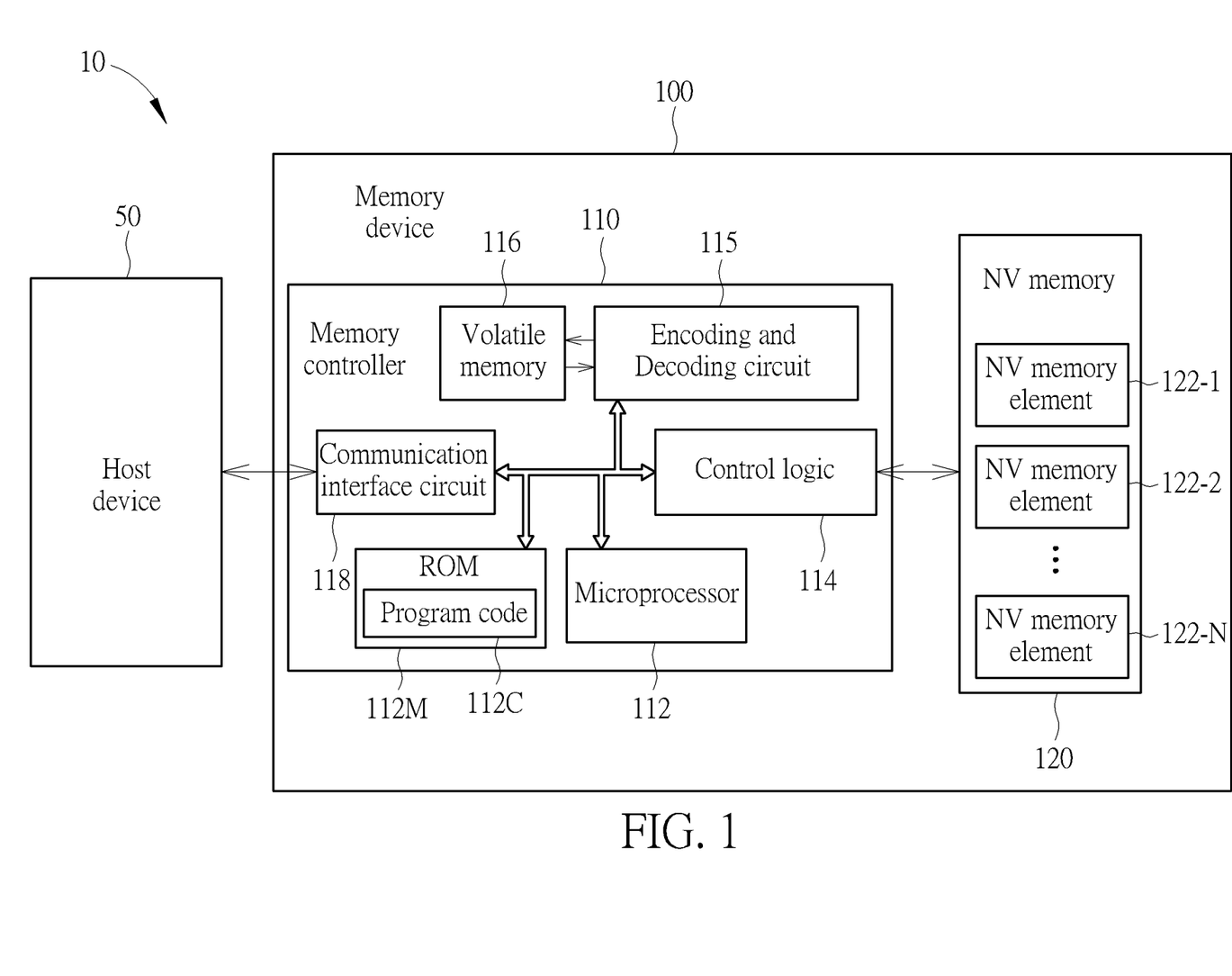
FIG. 1 illustrates a diagram of an electronic device according to one embodiment of the present invention.

FIG. 1 illustrates an electronic device 10 according to one embodiment of the present invention. The electronic device 10 comprises a host device 50 and a memory device 100. The host device 50 comprises at least one processor (not shown), which is operable to control operations of the host device 50. The memory device 100 is operable to provide storage space to the host device 50. Examples of the host device 50 comprise (but not limited to): multifunctional mobile phone, tablet, wearable device, and personal computer, such as desktop and laptop. Examples of memory device 100 comprise (but not limited to): portable memory device (such as memory card compliant with SD/MMC, CF, MS, XD or UFS standard), solid state drive and any types of embedded storage devices (such as embedded storage devices compliant with UFS or EMMC standard). According to this embodiment, the memory device 100 could comprise a controller, such as memory controller 110, and also comprise a non-volatile memory (NV memory) 120, wherein the controller is arranged to access the NV memory 120 and the NV memory 120 is arranged to store information. The NV memory 120 could comprise at least one NV memory element (such as one or more NV memory element), such as a plurality of NV memory elements 122-1, 122-2, . . . and 122-N, where "N" represent a positive integer greater than one. For example, the memory 120 could be a flash memory and the NV memory elements 122-1, 122-2 . . . and 122-N could be a plurality of flash memory chips or a plurality of flash memory dies. However, this is not intended to be a limitation of the present invention.

As illustrated by FIG. 1, the memory controller 110 comprises a processing circuit (such as a microprocessor 112), a storage unit (such as read-only memory) 112M, a control logic 114, an encoding and decoding circuit 115, a volatile memory 116 and a communication interface circuit 118, wherein at least one portion of these elements (e.g. a portion or all) are coupled to each other through a bus. The volatile memory 116 is implemented with random access memory (RAM). For example, the volatile memory 116 could be a SRAM, but this is not intended to be a limitation of the present invention. The volatile memory 116 is operable to provide its internal storage space to the memory controller 110, such as for temporary storage. The encoding and decoding circuit 115 is operable for data processing, such as data processing for error handling, but it is not intended to be a limitation of the present invention. On the other hand, the read-only memory 112M in this embodiment is operable for storing a program code 112C and the microprocessor 112 could be used for executing the program code 112C for controlling access to the NV memory 120. Please note that the program code 112C can also be stored in the volatile memory 116 or any other types of memories. In addition, the control logic 114 could comprise an error correction code circuit (not shown), thereby to protect data, and/or perform error correction. The communication interface circuit 118 may comply with a specific communication standard (; such as, serial advanced technology attachment (SATA) standard, universal serial bus (USB) standard, peripheral component interconnect express (PCIE) standard, embedded multimedia card (eMMC) standard or universal flash storage (UFS) standard) and is operable to communicate with other devices according to the specific communication standard.

In this embodiment, the host device 50 can indirectly access the memory device 100 by sending a host command and a corresponding logical address to the memory controller 110. The memory controller 110 receives the host command the logical address, and translates the host command into memory operation instructions (which are simply called operation instructions). The memory controller 110 controls, through operation instructions, read or write/program operation on the NV memory 120 with respect to memory units or pages having specific physical addresses, wherein the physical addresses correspond to logical addresses.

II. Data Processor and Error Handling Architecture

The memory controller 110 can receive multiple host commands from the host device 50 and executes the multiple host commands. The memory controller 110 returns execution results of the multiple host commands to the host device 50. Especially, the microprocessor 112 controls the memory controller 110 according to one command from the host device 50 (e.g. one of the multiple host commands), thereby allowing the host device 50 to access NV memory 120 through the memory controller 110. While the memory controller 110 is controlling the memory device 100, data in the volatile memory 116, such as static RAM, may unintentionally change. For example, a certain bit in the data may be flipped due to external temperature or other factors. If the bit flipping under such condition is ignored, this may cause the system error or the system crush. The present invention utilizes data processor and error handling architecture to manage the memory system, thereby to effectively reduce the probability of the system error or the system crush, and further improve the overall performance of the memory device 100.

Figure 2:
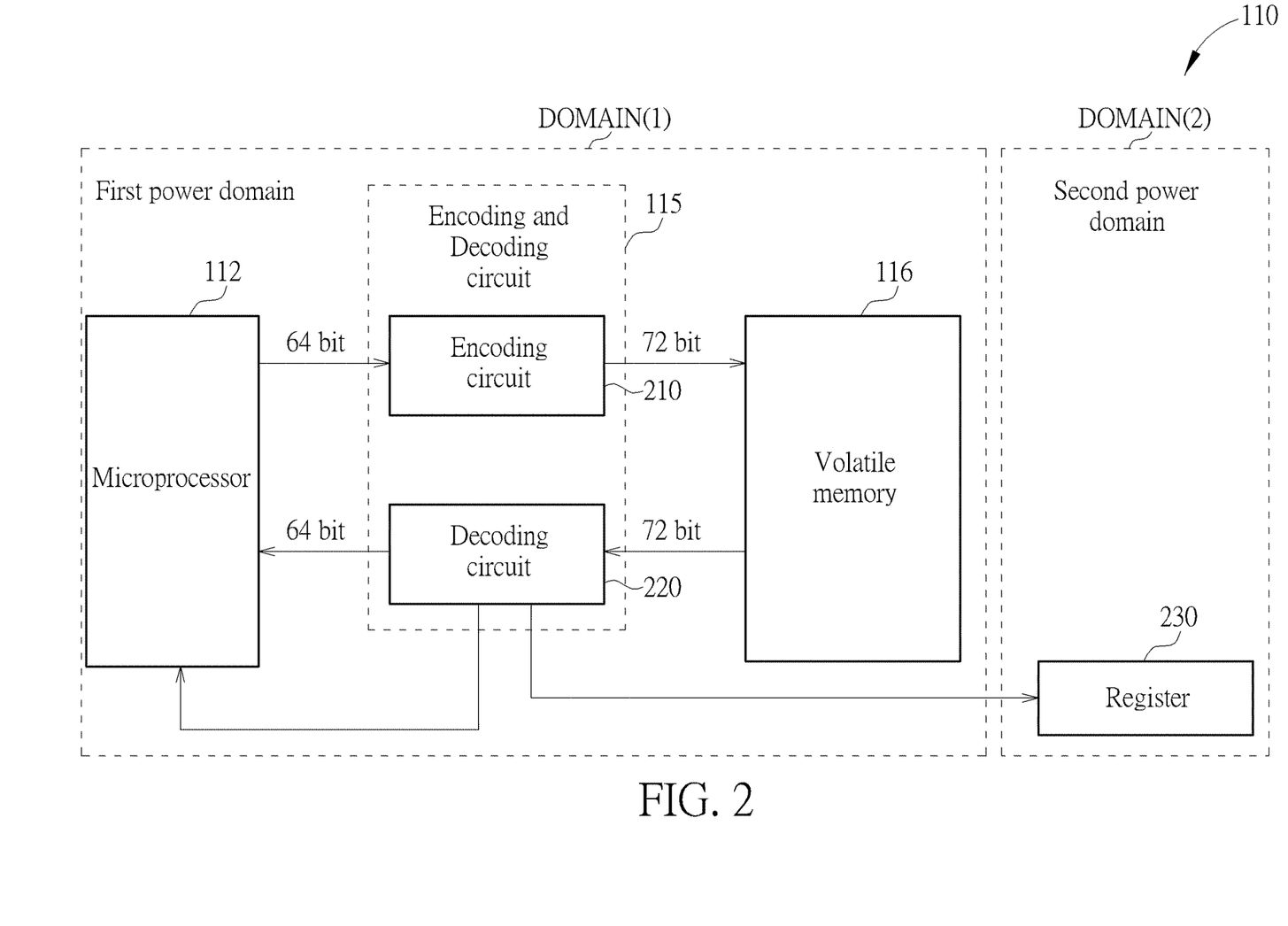
FIG. 2 illustrates a diagram showing detailed implementation of the memory device illustrated in FIG. 1 according to one embodiment of the present invention.

FIG. 2 illustrates a detailed implementation of the memory device 100 shown in FIG. 1 according to one embodiment of the resent invention. The encoding and decoding circuit could comprise an encoding circuit 210 and a decoding circuit 220 and the memory controller 110 could comprise a register 230, wherein each one of the encoding circuit 210 and the decoding circuit 220 is coupled to the microprocessor 112 and the volatile memory 116, and the register 230 is coupled to the decoding circuit 220. According to this embodiment, the microprocessor 112 can be disposed in a first power domain DOMAIN(1) of the memory controller 110. The register 230 can be disposed in a second power domain DOMAIN(2) of the memory controller 110. The first power domain DOMAIN(1) is independent from the second power domain DOMAIN(2). For example, the second power domain DOMAIN(2) can be configured to keep providing power to the register 230 regardless of occurrence of power failure in the first power domain DOMAIN(1). Moreover, the encoding circuit 210 is operable to perform encoding operation, such as converting 64-bit long data into 72-bit long encoded data and store the encoded data into the volatile memory 116, but this is not intended to be a limitation of the present invention. The decoding circuit 220 is operable to perform decoding operation, such as converting 72-bit long encoded data into 64-bit long data and detect occurrence of bit flipping, but this is not a limitation of the present invention. When bit flipping occurs, the decoding circuit 220 is operable to store related information (e.g. error information) into the register 230 and output a predetermined signal INT to the microprocessor 112 to notify the microprocessor 112, wherein the predetermined signal INT could be an interrupt signal, but this is not a limitation of the present invention. For example, bit flipping may cause the microprocessor 112 to malfunction (especially leading to the system error or crush) and therefore the first power domain DOMAIN(1) may have a temporary power failure. Under such condition, as the second power domain DOMAIN(2) keeps providing power to the register 230, the microprocessor 112 can obtain related information (e.g. the error information) from the register 230 for further processing when the system backs to normal. Alternatively, the bit flipping may not cause the microprocessor 112 to malfunction. Under such condition, the microprocessor 122 is operable to immediately perform at least one recovery operation, which can be performed according to the related information stored in the register 230 (e.g. error information). However, this is not intended to be a limitation of the present invention. Examples of the above-mentioned at least one recovery operation comprises (but not limited to): re-obtaining correct data, re-performing data access and re-performing associated operations.

III. System Management

Figure 3:
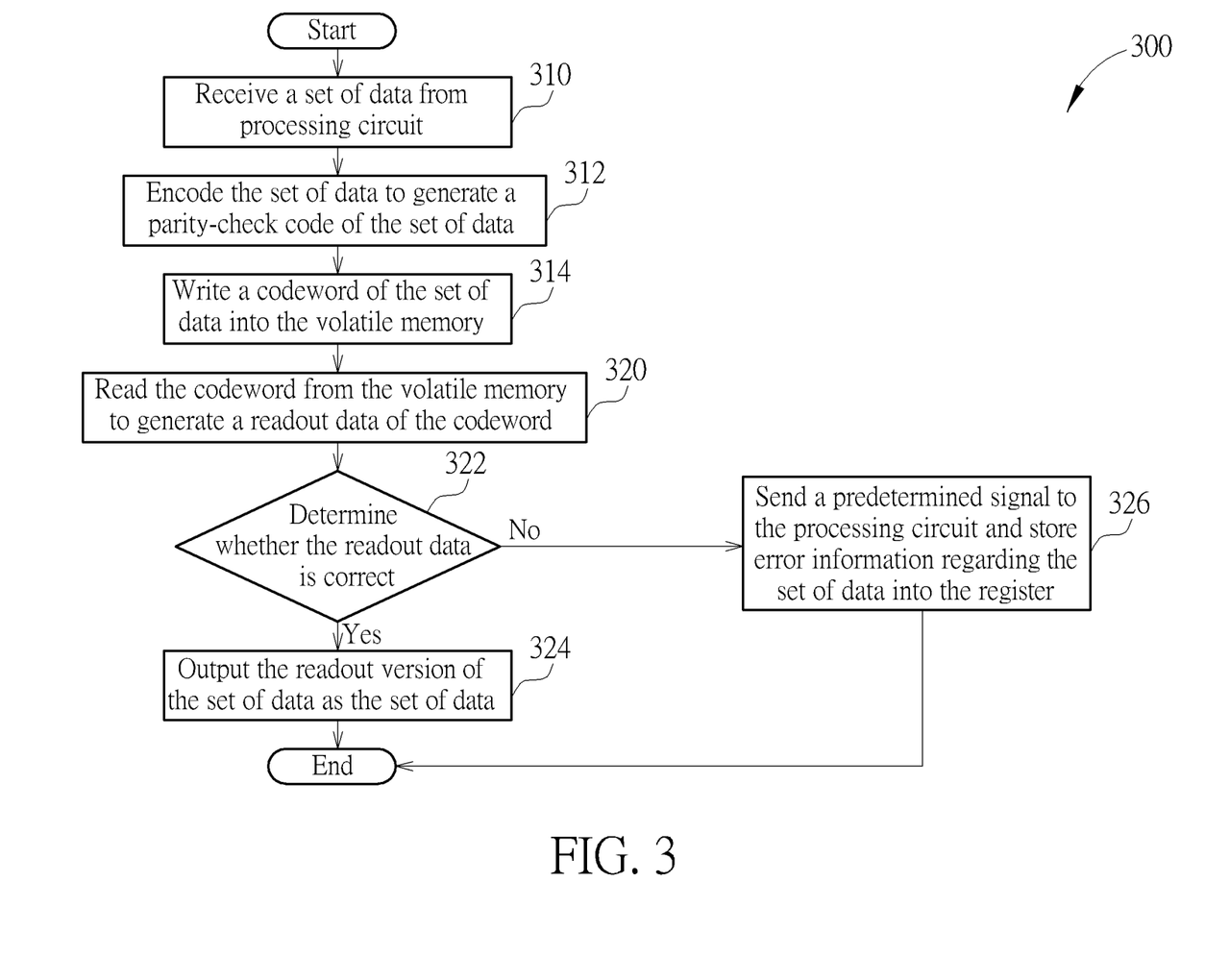
FIG. 3 illustrates a flowchart of a method for performing data processing for error handling in a memory device according to one embodiment of the present invention.

FIG. 3 illustrates a flow chart of a method for performing data processing for error handling in a memory device according to one embodiment of the present invention. The method 300 can be used in the electronic device 10 and the memory device 100 as well as be applied to the controller, such as the memory controller 110. For example, under control of the processing circuit, such as, the microprocessor 112, the memory controller 110 is operable to control at least one operation of the memory device 100.

As step 310, when the memory controller 110 is controlling the at least one operation of the memory device 100, the encoding circuit 210 is operable to receive a set of data from the processing circuit, such as the microprocessor 112, for writing into the volatile memory 116, wherein the set of data is associated with the at least one operation controlled by the memory controller 110.

At step 312, before the set of data is written into the volatile memory 116, the encoding circuit 210 is operable to encode the set of data to generate a parity-check code of the set of data.

At step 314, the encoding circuit 210 is operable to write a codeword of the set of data into the volatile memory 116, wherein the codeword comprises the set of data and the parity-check code.

At step 320, the decoding circuit 220 is operable to read the codeword from the volatile memory 116, thereby to generate a readout data of the codeword, wherein the readout data comprises a readout version of the set of data and a readout version of the parity-check code.

At step 322, the decoding circuit 220 is operable to determine whether the readout data is correct according to the readout version of the set of data and the readout version of the parity-check code. If the readout data is determined correct, the flow goes to step 324; otherwise, the flow goes to step 326.

At step 324, the decoding circuit 220 is operable to output the readout version of the set of data, as the set of data, to the processing circuit, such as the microprocessor 112, for further processing.

At step 326, the decoding circuit 220 is operable to send a predetermined signal INT to the processing circuit, such as the microprocessor 112, and store error information regarding the set of data into the register 230. For example, in response to the readout version of the set of data, the microprocessor 112 may malfunction, wherein the second power domain DOMAIN(2) is operable to keep providing power to the register 230, thereby to protect the error information in the register 230. Alternatively, the microprocessor 112 may not malfunction and is operable to perform the above-mentioned at least one recovery operation according to the error information in the register 230, but this is not intended to be a limitation of the present invention.

According to this embodiment, the memory controller 110 (e.g. the microprocessor 112 or the decoding circuit 220) is operable to store the error information in the register 230 further into the NV memory 120 for further processing. Furthermore, the error information stored in the register 230 may comprise a memory address of the volatile memory 116 and the memory address indicates where the set of data is stored in the volatile memory 116. For example, the error information may further comprise a hardware identifier of the volatile memory 116 and the hardware identifier can be used to identify the volatile memory 116. However, this is not intended to be a limitation of the present invention. Furthermore, the predetermined signal INT can indicate an occurrence of a memory error regarding the readout data. For example, in response to a read operation executed by the microprocessor 112, the readout data of the codeword is read from the volatile memory 116. When the memory error is detected (assuming that a certain bit of the readout data has been flipped), the microprocessor 112 has already performed a next operation, wherein the next operation may be based on the readout data, such as data with errors. Although the microprocessor 112 may have no time to deal with the memory error, the microprocessor 112 is still able to perform the above-mentioned at least one recovery operation.

According to some embodiments, the at least one operation controlled by the memory controller 110 comprises at least one of: accessing (e.g. reading or writing/programming) the NV memory 120; and performing data management on the NV memory 120 (e.g. garbage collection or wear leveling).

Figure 4:
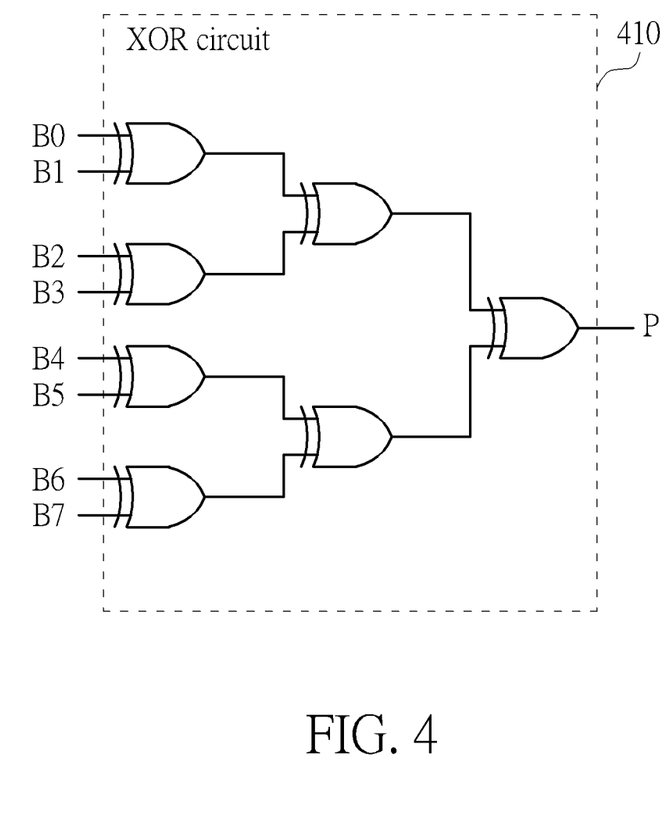
FIG. 4 illustrates a solution of data processing of the method of FIG. 3 according to one embodiment of the present invention.

FIG. 4 illustrates a solution of data processing of the method of FIG. 3 according to one embodiment of the present invention. The encoding and decoding circuit 115 could comprise at least one exclusive OR (XOR) circuit, such as XOR circuit 410. For example, the encoding circuit 210 could comprise the XOR circuit 410, whereas the decoding circuit 220 could comprise a duplication of the XOR circuit 410. However, this is not intended to be a limitation of the present invention. According to various embodiments of the present invention, the encoding circuit 210 could comprise the XOR circuit 410 and the decoding circuit 220 could share the XOR circuit 410 with the encoding circuit 210.

As illustrated by FIG. 4, the XOR circuit 410 could comprise a plurality of XOR gates, which are employed for performing XOR operations, respectively. The leftmost four XOR gates in the drawing can receive bits {B0, B1, B2, B3, B4, B5, B6, B7} of one byte, respectively. The middle two XOR gates in the drawing can receive results of the XOR operations performed by the leftmost four XOR gates, receptively. The rightmost one XOR gate can receive results of the XOR operations performed by the middle two XOR gates, respectively. The XOR circuit 410 uses a result of the XOR operation performed by the rightmost one XOR gate, as a parity-check code P for bits {B0, B1, B2, B3, B4, B5, B6, B7}. However, this is not intended to be a limitation of the present invention. According to this embodiment, at step 312, the encoding circuit 210 can use the XOR circuit 410 to encode any byte of the set of data, wherein each bit in this byte could be received as bits {B0, B1, B2, B3, B4, B5, B6, B7} and the parity-check code P could be outputted as a parity-check code of the byte, such as a subset of the parity-check code of the set of data. In addition, at step 322, the decoding circuit 220 could use the duplication of the XOR circuit 410 to encode the readout version of the set of data, thereby to generate another parity-check code, especially encode any byte of the readout version of the set of data, to generate a parity-check code of this byte, such as a subset of the another parity-check code. The decoding circuit 220 is operable to compare the readout version of the parity-check code with the another parity-check code to determine whether the readout data is correct. For example, when the readout version of the parity-check code is identical to the another parity-check code, the decoding circuit 220 determines the readout data is correct, where the flow goes to step 324; otherwise, the decoding circuit 220 determines the readout data is incorrect, where the flow goes to step 326. Similar contents in this embodiment and the above-mentioned embodiments are omitted here for sake of brevity.

Figure 5:
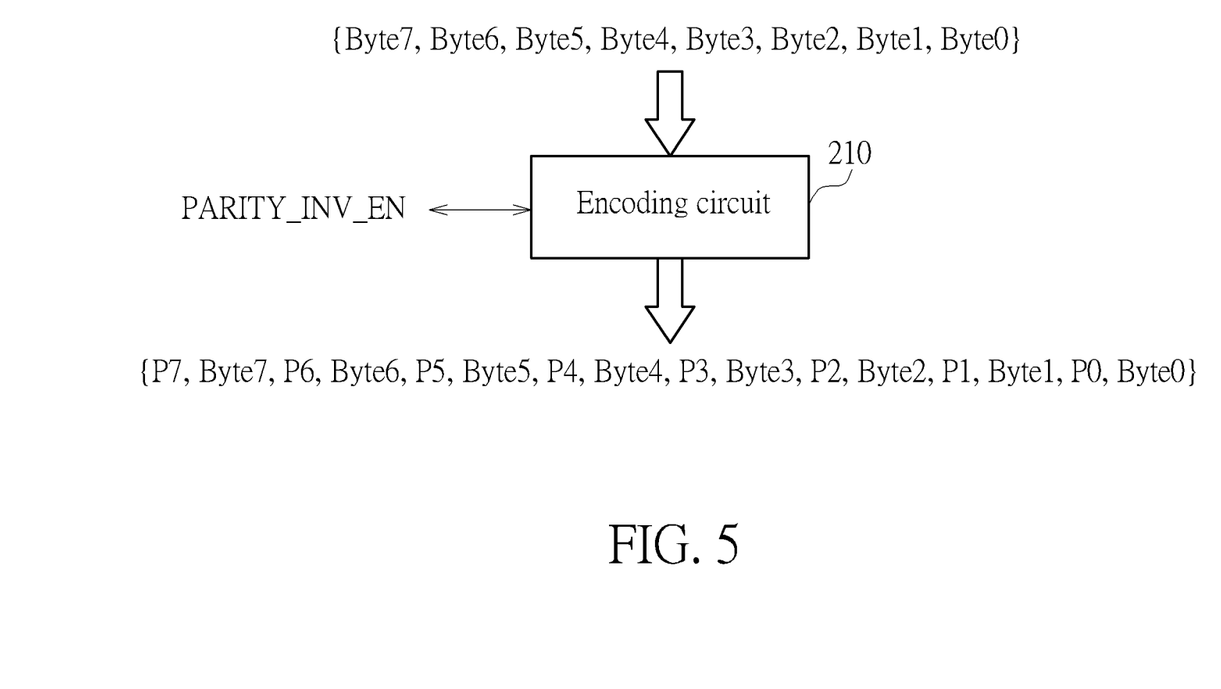
FIG. 5 illustrates a solution of encoding and testing of the method of FIG. 3 according to one embodiment of the present invention.

FIG. 5 illustrates a solution of encoding and testing of the method 300 in FIG. 3 according to one embodiment of the present invention. At step 312, the encoding circuit 210 is operable to use the XOR circuit 410 to respectively encode eight bytes {Byte7, Byte6, Byte5, Byte4, Byte3, Byte2, Byte1, Byte0} of the set of data, thereby to generate corresponding parity-check codes {P7, P6, P5, P4, P3, P2, P1, P0} and output the encoded data {P7, Byte7, P6, Byte6, P5, Byte5, P4, Byte4, P3, Byte3, P2, Byte2, P1, Byte1, P0, Byte0}. In addition, the memory controller 110 (e.g. the microprocessor 110) is operable to use the enablement signal PARITY_INV_EN to enable or control one or more bits in a specific parity-check code to be flipped, in order to test the error handling architecture of the present invention.

Figure 6:
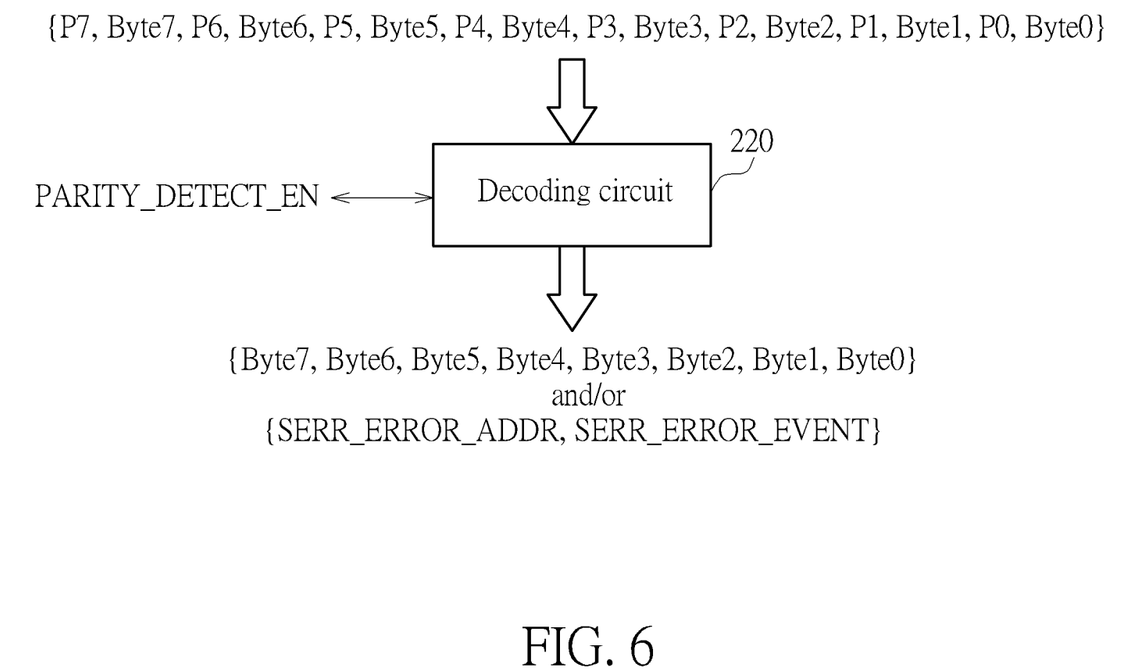
FIG. 6 illustrates a solution of decoding and error detection of the method of FIG. 3 according to one embodiment of the present invention.

FIG. 6 illustrates an implementation of decoding and error detection of the method 300 in FIG. 3 according to one embodiment of the present invention. At step 322, the decoding circuit 220 can use the duplication of the XOR circuit 410 to encode the readout version of the set of data, such as encoded data {P7, Byte7, P6, Byte6, P5, Byte5, P4, Byte4, P3, Byte3, P2, Byte2, P1, Byte1, P0, Byte0}, thereby to generate the another parity-check code. Accordingly, the decoding circuit 220 is operable to compare the readout version of the parity-check code and the another parity-check code, thereby to determine whether the readout data is correct. For example, at step 324, the decoding circuit 220 is operable to output these eight bytes {Byte7, Byte6, Byte5, Byte4, Byte3, Byte2, Byte1, Byte0}. Alternatively, at step 326, the decoding circuit 220 is operable to output error information signal SERR_ERROR_ADDR to the register 230, thereby to store the error information regarding the set of data into the register 230, wherein the error information signal SERR_ERROR_ADDR carries a memory address of the volatile memory 116, such as the address where the error occurs. The decoding circuit 220 is operable to output error information signal SERR_ERROR_EVENT to the microprocessor 112, thereby to inform the microprocessor 112 of the information related to the error, wherein the error information signal SERR_ERROR_EVENT could be regarded as another example of the predetermined signal INT. In addition, memory controller 110 (e.g. microprocessor 110) is operable to use the enablement signal PARITY_DETECT_EN to enable or disable the error detection function of the decoding circuit 220.

According to some embodiments, the data source of the set of data mentioned in step 310 could be different. For example, the data source of the set of data could be the communication interface circuit 118. According to some embodiments, step 310 can be replaced with step 310'.

At step 310', while the memory controller 110 is controlling the at least one operation of the memory device 100, the encoding circuit 210 is operable to receive a set of data from the communication interface circuit 118 for writing into the volatile memory 116, wherein the set of data is associated with the at least one operation controlled by the memory controller 110.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing data processing for error handling in a memory device, wherein the memory device comprises a non-volatile memory (NV memory), the NV memory comprises at least one NV memory element, the method comprising:
   when a controller of the memory device is controlling at least one operation of the memory device, receiving a set of data from a processing circuit of the controller for writing into a volatile memory of the controller, wherein the controller is disposed in the memory device and outside of the NV memory, the processing circuit and the volatile memory are disposed in the controller, and the set of data is associated with the at least one operation controlled by the controller;
   before the set of data is written into the volatile memory, encoding the set of data to generate a parity-check code of the set of data;
   writing a codeword of the set of data into the volatile memory, wherein the codeword comprises the set of data and the parity-check code;
   reading the codeword from the volatile memory to generate a readout data of the codeword, wherein the readout data comprises a readout version of the set of data and a readout version of the parity-check code;
   determining whether the readout data is correct according to the readout version of the set of data and the readout version of the parity-check code; and
   when the readout data is determined correct, outputting the readout version of the set of data, as the set of data, to the processing circuit for further processing; otherwise, sending a predetermined signal to the processing circuit and storing error information regarding the set of data into a register, wherein the error information comprises a memory address and a hardware identifier of the volatile memory, and the register is disposed in the controller and outside of the processing circuit, the volatile memory and the NV memory.

2. The method of claim 1, wherein the processing circuit is disposed in a first power domain of the controller and the register is disposed in a second power domain of the controller; and the first power domain is independent from the second power domain.

3. The method of claim 2, wherein the processing circuit malfunctions in response to the readout version of the set of data; and the second power domain is configured to keep providing power to the register in order to protect the error information stored in the register.

4. The method of claim 2, wherein the second power domain is configured to keep providing power to the register regardless of occurrence of power failure in the first power domain.

5. The method of claim 1, further comprising:
   storing the error information in the register into the NV memory for further processing.

6. The method of claim 1, wherein the memory address of the error information indicates where the set of data is stored in the volatile memory.

7. The method of claim 1, wherein the hardware identifier of the error information is arranged to identify the volatile memory.

8. The method claim 1, wherein the predetermined signal indicates an occurrence of a memory error regarding the readout data.

9. The method of claim 8, wherein in response to a read operation performed by the processing circuit, the readout data of the codeword is read from the volatile memory; and the processing circuit has already performed a next operation when the memory error is detected.

10. The method of claim 1, wherein the at least one operation controlled by the controller comprises at least one of following operations:
    accessing the NV memory; and
    performing data management on the NV memory.

11. A memory device, comprising:
    a non-volatile memory (NV memory) arranged to store information, wherein the NV memory comprises at least one NV memory element; and a controller, coupled to the NV memory, arranged to control at least one operation of the memory device, wherein the controller comprises:
   a processing circuit arranged to control the controller according to a command from a host device, thereby allowing the host device to access the NV memory through the controller;
   a volatile memory arranged to provide internal storage space to the controller, thereby allowing the controller to control the at least one operation of the memory device;
   an encoding and decoding circuit, arranged to perform data processing, wherein the encoding and decoding circuit comprises:
      an encoding circuit, coupled to the processing circuit and the volatile memory, wherein:
         when the controller is controlling the at least one operation of the memory device, the encoding circuit receives a set of data from the processing circuit for writing into the volatile memory, wherein the set of data is associated with the at least one operation controlled by the controller;
         before the set of data is written into the volatile memory, the encoding circuit encodes the set of data to generate a parity-check code of the set of data; and
         the encoding circuit writes a codeword of the set of data into the volatile memory, wherein the codeword comprises the set of data and the parity-check code; and
      a decoding circuit, coupled to the processing circuit and the volatile memory, wherein:
         the decoding circuit reads the codeword from the volatile memory to generate a readout data of the codeword, wherein the readout data comprises a readout version of the set of data and a readout version of the parity-check code;
         the decoding circuit determines whether the readout data is correct according to the readout version of the set of data and the readout version of the parity-check code; and
         when the readout data is determined correct, the decoding circuit outputs the readout version of the set of data, as the set of data, to the processing circuit for further processing; otherwise, the decoding circuit sends a predetermined signal to the processing circuit and stores error information regarding the set of data into a register of the controller, the error information comprising a memory address and a hardware identifier of the volatile memory; and
   the register, coupled to the decoding circuit, arranged to store the error information regarding the set of data and outside of the processing circuit, the volatile memory and the NV memory;
   wherein the controller is disposed in the memory device and outside of the NV memory, and the processing circuit and the volatile memory are disposed in the controller.

12. The memory device of claim 11, wherein the processing circuit is disposed in a first power domain of the controller and the register is disposed in a second power domain of the controller; and the first power domain is independent from the second power domain.

13. The memory device of claim 12, wherein the processing circuit malfunctions in response to the readout version of the set of data; and the second power domain is configured to keep providing power to the register in order to protect the error information stored in the register.

14. The memory device of claim 12, wherein the second power domain is configured to keep providing power to the register regardless of occurrence of power failure in the first power domain.

15. The memory device of claim 11, wherein the controller stores the error information in the register into the NV memory for further processing.

16. An electronic device comprising the memory device of claim 11, further comprising:
   the host device, coupled to the memory device, wherein the host device comprises:
      at least one processor arranged to control operations of the host device;
   wherein the memory device is arranged to provide storage space to the host device.

17. A controller for a memory device, the memory device including the controller and a non-volatile memory (NV memory), the NV memory including at least one NV memory element, the controller comprising:
   a processing circuit arranged to control the controller according to a command from a host device, thereby allowing the host device to access the NV memory through the controller;
   a volatile memory arranged to provide internal storage space to the controller, thereby allowing the controller to control the at least one operation of the memory device;
   an encoding and decoding circuit, arranged to perform data processing, wherein the encoding and decoding circuit comprises:
      an encoding circuit, coupled to the processing circuit and the volatile memory, wherein:
         when the controller is controlling the at least one operation of the memory device, the encoding circuit receives a set of data from the processing circuit for writing into the volatile memory, wherein the set of data is associated with the at least one operation controlled by the controller;
         before the set of data is written into the volatile memory, the encoding circuit encodes the set of data to generate a parity-check code of the set of data; and
         the encoding circuit writes a codeword of the set of data into the volatile memory, and the codeword comprises the set of data and the parity-check code; and
      a decoding circuit, coupled to the processing circuit and the volatile memory, wherein:
         the decoding circuit reads the codeword from the volatile memory to generate a readout data of the codeword and the readout data comprises a readout version of the set of data and a readout version of the parity-check code;
         the decoding circuit determines whether the readout data is correct according to the readout version of the set of data and the readout version of the parity-check code; and
         when the readout data is determined correct, the decoding circuit outputs the readout version of the set of data, as the set of data, to the processing circuit for further processing;
         otherwise, the decoding circuit sends a predetermined signal to the processing circuit and stores error information regarding the set of data into a register of the controller, the error information comprising a memory address and a hardware identifier of the volatile memory; and the register, coupled to the decoding circuit, arranged to store the error information regarding the set of data and outside of the processing circuit, the volatile memory and the NV memory;

wherein the controller is disposed in the memory device and outside of the NV memory, and the processing circuit and the volatile memory are disposed in the controller.

18. The controller of claim 17, wherein the processing circuit is disposed in a first power domain of the controller and the register is disposed in a second power domain of the controller; and the first power domain is independent from the second power domain.

19. The controller of claim 18, wherein the processing circuit malfunctions in response to the readout version of the set of data; and the second power domain is configured to keep providing power to the register in order to protect the error information stored in the register.

20. The controller of claim 18, wherein the second power domain is configured to keep providing power to the register regardless of occurrence of power failure in the first power domain.

* * * * *